United States Patent [19]
Widmer

[11] 3,973,199
[45] Aug. 3, 1976

[54] PREDICTION DIFFERENTIAL PULSE CODE MODULATION SYSTEM WITH ADAPTIVE COMPOUNDING

[75] Inventor: Walter Widmer, Wadenswil, Switzerland

[73] Assignee: U.S. Philips Corporation, New York, N.Y.

[22] Filed: Aug. 29, 1974

[21] Appl. No.: 501,485

[30] Foreign Application Priority Data
Sept. 3, 1973 Netherlands.................... 7312104

[52] U.S. Cl. ............................ 325/38 B; 325/141; 332/11 D
[51] Int. Cl.² ........................................ H04B 1/00
[58] Field of Search .............. 325/38 R, 62, 38 B, 325/141; 332/11 D; 179/15 AV

[56] References Cited
UNITED STATES PATENTS

| | | | |
|---|---|---|---|
| 3,502,986 | 3/1970 | Lucky | 325/38 R |
| 3,555,423 | 1/1971 | Weston | 325/38 B |
| 3,729,678 | 4/1973 | Glasbergen et al. | 325/38 B |
| 3,806,810 | 4/1974 | Widmer et al. | 325/141 |
| 3,831,092 | 8/1974 | Greefkes | 325/38 B |
| 3,859,597 | 1/1975 | Zwaal | 325/38 B |

*Primary Examiner*—Robert L. Griffin
*Assistant Examiner*—Jin F. Ng
*Attorney, Agent, or Firm*—Frank R. Trifari; George B. Berka

[57] ABSTRACT

The adaptive differential PCM transmission system uses a first-order prediction and a simple quantizing step-wise adaptation to improve signal-to-quantizing noise ratio.

12 Claims, 7 Drawing Figures

PREDICTION DIFFERENTIAL PULSE CODE MODULATION SYSTEM WITH ADAPTIVE COMPOUNDING

The invention relates to a transmission system including a transmitter and a receiver for transmitting information signals by means of a pulse code, the information signal to be transmitted in the transmitter being applied through a sampling circuit to an arrangement provided with a non-uniform quantizing circuit whose output signal is transmitted to the receiver by means of pulse code modulation and to a local receiver incorporated in the transmitter, said two receivers being provided with a predictor for generating a prediction signal which is combined in an adder with a signal derived from the quantizing circuit for constituting an input signal for the predictor, the prediction signal and the sampled information signal in the transmitter being applied to a difference producer for obtaining a difference signal constituting the input signal of the quantizing circuit. Such systems are particularly used for the transmission of speech signals.

In all transmission systems in which the information signals are transmitted by means of pulse code modulation (PCM) the noise caused by the amplitude quantisation affects the transmission quality. This quantisation noise can be reduced by using a PCM coding having a larger number of code bits per signal sample; this is, however, accompanied by an increase in the pulse frequency and thus requires a larger bandwidth of the transmission path. Another possibility of enhancing the transmission quality consists in the use of a non-uniform PCM coding with, for example, a piece wise linear compression characteristic according to the CEPT standard. Although a substantially constant ratio between signal and quantisation noise is obtained over a large signal range, a PCM coding with at least eight code bits per signal sample is necessary for obtaining a satisfactory transmission quality of speech signals.

It is an object of the invention to provide a transmission system of the kind described in the preamble in which by utilizing the properties of the information signals a considerable improvement of the transmission quality is realised, which improvement makes it also possible to enlarge the dynamic range of the information signals in which a satisfactory transmission quality is obtained while reducing the bandwidth required in the transmission path.

The transmission system according to the invention is characterized in that the transmitter includes dynamic control means for controlling the dynamic range of the quantizing circuit for its input signal, said two receivers also including dynamic control means for controlling the dynamic range of the quantizing circuit for the signal applied to the adder, the transmitter and the receiver including a control generator fed by the input signal from the predictor, said generator being provided with a storage network and an averaging network for obtaining a control signal which corresponds to the average of the absolute values of the predictor input signal over a limited number of sampling periods, said control signal being applied to a control input of the dynamic control means.

The invention and its advantages will now be described in greater detail with reference to the Figures.

Figure 1:
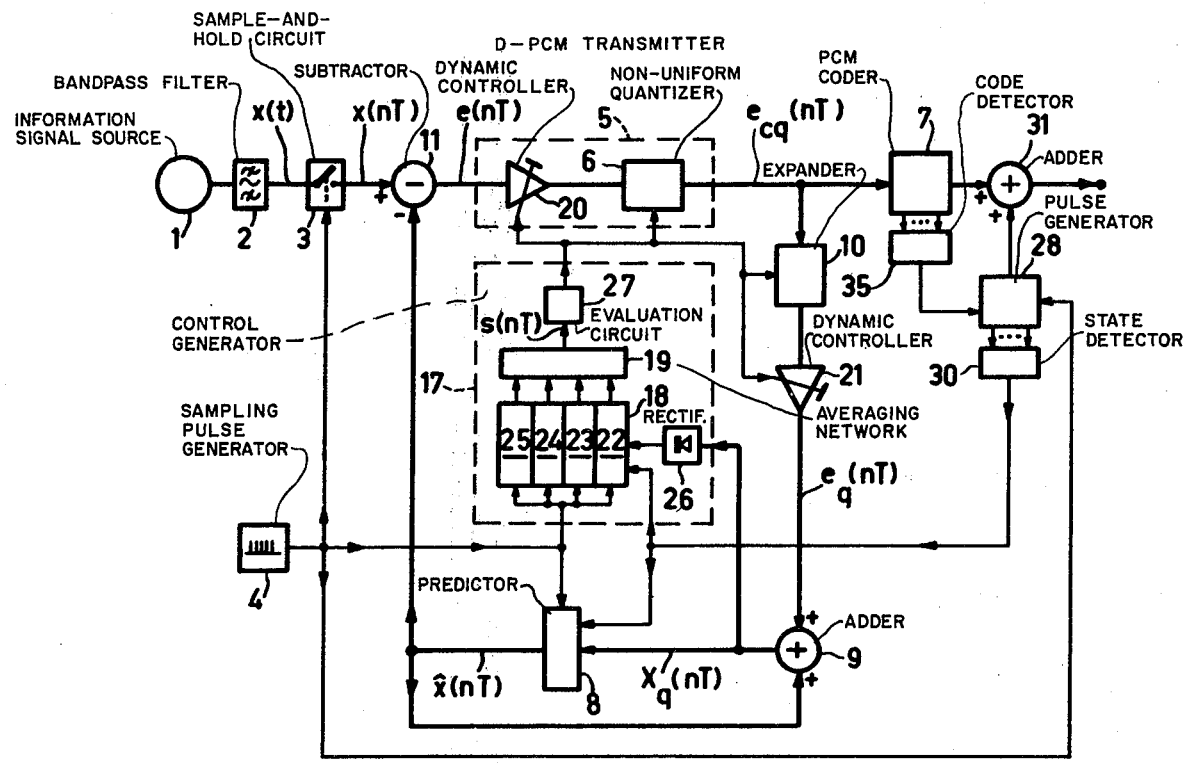
FIG. 1 shows the block schematic diagram of the transmitter and FIG. 2 shows the block schematic diagram of the receiver of a transmission system according to the invention.
Figure 2:
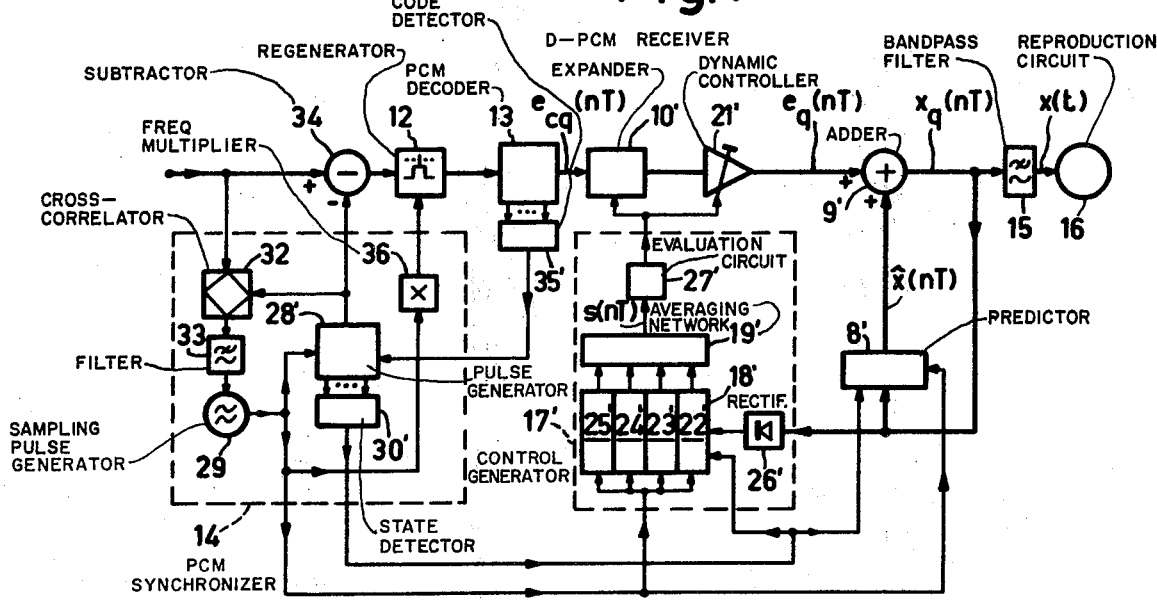

The transmission system shown in a block schematic form in FIGS. 1 and 2 is arranged for the transmission of speech signals by means of differential pulse code modulation (D-PCM).

In the transmitter of FIG. 1 the speech signal derived from a signal source 1 is applied through a band-pass filter 2 having a passband of, for example, 0.3–4.0 kHz to a sample-and-hold circuit 3 fed by a sampling pulse generator 4 having a pulse frequency of, for example, 9 kHz. An arrangement 5 including a non-uniform quantizing circuit 6 whose output signal is coded in a PCM coding circuit 7 with, for example, eight code bits per signal sample is connected to sampling circuit 3. Apart from the non-uniform quantisation the relationship between input signal and output signal of quantizing circuit 6 may be linear, but for a general sake it is assumed in the further description that this relationship is non-linear and that, for example, a compression is also effected in addition to the non-uniform quantisation in quantizing circuit 6 of FIG. 1. In the non-uniform PCM coding thus realised the signal compression is effected, for example, in accordance with the piecewise linear compression characteristic according to the CEPT standard (Conférence Européenne de Poste et Télécommunication). The code bits occurring at the output of the PCM coding circuit 7 are transmitted to the receiver of FIG. 2.

In the transmitter according to FIG. 1 the output signal from the non-uniform quantizing circuit 6 is also applied to a local receiver which includes a predictor 8 for generating a prediction signal from the previous signal samples. This prediction signal is combined in an adder 9 with a signal derived from the non-uniform quantizing circuit 6 for obtaining the input signal for predictor 8. If quantizing circuit 6 has a relationship between the input and the output signal which, apart from quantisation, is linear, the output signal from quantizing circuit 6 could be directly applied to adder 9. However, since it has been assumed that the input signal in quantizing circuit 6 is generally also subjected to an operation resulting in a non-linear relationship between the input and the output signal, the output signal from quantizing circuit 6 must first be subjected to a reciprocal non-linear operation before it is combined with the prediction signal in adder 9. Particularly in the transmitter in FIG. 1 in which a compression is effected in quantizing circuit 6, the output signal from quantizing circuit 6 must undergo an expansion, which is reciprocal to this compression, in an expander circuit 10 before it is applied to adder 9.

Furthermore the prediction signal and the sampled speech signal are applied in the transmitter to a difference producer 11 for obtaining a difference signal which constitutes the input signal for the compressing non-uniform quantizing circuit 6. In the transmitter according to FIG. 1 the quantized and coded difference between the sampled speech signal and the prediction signal obtained in the local receiver is thus transmitted to the receiver according to FIG. 2.

The receiver cooperating with the transmitter of FIG. 1 is shown in FIG. 2. The code bits transmitted through a transmission path not further shown are applied after regeneration in a regenerator 12 to a PCM decoding circuit 13 associated with PCM coding circuit 7 in the transmitter. As a result a signal is obtained at the output of PCM decoding circuit 13 which corresponds to the output signal of the compressing non-uniform quantizing circuit 6 in the transmitter. The code bit frequency required for regeneration and the sampling frequency of 9 kHz are derived from the transmitted signals by means of a PCM synchronizing circuit 14 which can be formed in a manner conventional for PCM transmission.

The output signal from PCM decoding circuit 13 is processed in the receiver according to FIG. 2 in exactly the same manner as the corresponding output signal from the compressing non-uniform quantizing circuit 6 in the local receiver of the transmitter of FIG. 1. The elements required for this purpose are denoted by the same reference numerals in the receiver as the corresponding elements in the transmitter, but are provided with indices in FIG. 2. The prediction signal derived from predictor 8' is combined with the signal derived from expander circuit 10' in adder 9' to a signal which is applied to a reproduction circuit 16 through a bandpass filter 15 passing the desired speech band and suppressing frequencies located above this band.

In the speech transmission system of FIGS. 1 and 2 the predictors 8 and 8' are formed as storage elements controlled by the sampling frequency of 9 kHz and holding a signal applied thereto during one sampling period.

The operation of the speech transmission system described so far will now be explained. If a speech signal $x(t)$ is applied to sampling circuit 3 and sampling is carried out with a sampling period T(T is thus equal to one period of the pulse frequency of 9 kHz) the signal samples $x(nT)$ occur at instants $t=nT$ ($n$ is an integer) at the output of sampling circuit 3. A difference signal $e(nT)$ is constituted in subtractor or difference producer 11 from a signal sample $x(nT)$ and a prediction signal $\hat{x}(nT)$ generated by the predictor 8, which difference signal is given by:

$$e(nT) = x(nT) - \hat{x}(nT) \tag{1}$$

The compressed quantized difference signal $e_{cq}(nT)$ is generated with the aid of the quantizing circuit 6, which signal is transmitted to the receiver after coding in PCM coding circuit 7.

The prediction signal $\hat{x}(nT)$ desired at a given instant $t=nT$ should in theory be derived from the signal samples of the speech signal $x(t)$ at previous sampling instants $t=(n-1)T, (n-2)T \ldots$ However, since the prediction signal in transmitter and receiver must be obtained in exactly the same manner and since only quantized values are available in the receiver, the prediction signal $\hat{x}(nT)$ is derived from the previous quantized signal samples $x_q\{(n-1)T\}, x_q\{(n-2)T\} \ldots$ and in the used predictor 8 it is derived by exclusively retaining the immediately preceding quantized signal sample $x_q\{(n-1)T\}$ during one sampling period T, thus:

$$\hat{x}(nT) = x_q\{(n-1)T\} \tag{2}$$

The input signal of predictor 8 is then constituted by the quantized signal samples $x_q(nT)$ for which on the basis of formula (1) there applies that:

$$x_q(nT) = \hat{x}(nT) + e_q(nT) \tag{3}$$

so that $x_q(nT)$ is obtained by combining in adder 9 the prediction signal $\hat{x}(nT)$ with the quantized difference signal $e_q(nT)$. The difference signal $e(nT)$ undergoes in quantizing circuit 6 a non-uniform quantisation and a compression so that the compressed quantized difference signal $e_{cq}(nT)$ at the output of quantizing circuit 6 must undergo an expansion which is reciprocal with this compression in expander circuit 10 so as to obtain the quantized difference signal $e_q(nT)$.

In the receiver the compressed quantized difference signal $e_{cq}(nT)$ is reobtained at the output of PCM decoding circuit 13, which signal is processed in exactly the same manner as in the local receiver of the transmitter. The quantized signal samples $x_q(nT)$ then occur at the output of adder 9', which samples yield a speech signal after filtering in bandpass filter 15 which, apart from quantisation noise and possible interference in the transmission path, corresponds to the speech signal $x(t)$ at the input of sampling circuit 3 in the transmitter.

The described transmission signal uses very simple signal predictors 8 and 8' which bring about a signal extrapolation of the order of zero with the aid of a storage element retaining the last preceding signal sample for one sampling period T. In the transmission of speech signals a satisfactory transmission quality is already obtained with this simple system.

The predictos 8 and 8' may alternatively be arranged for a signal extrapolation of a higher order in which different preceding signal samples are involved in the signal prediction. It is known from the statistical communication theory how such a signal prediction can be rendered optimum, provided that the relevant signals are stationary. It is, however, known that speech signals do not fulfil this condition. Since a signal extrapolation of a higher order requires predictors 8 and 8' having a considerably more complicated structure and since the Applicant has found from extensive experiments that no considerable further improvement of the signal prediction can be expected for speech signals, the described signal extrapolation of the order of zero is preferred with which, as already stated, a speech transmission of satisfactory quality is obtained.

According to the invention a considerable improvement of the already satisfactory transmission quality of the speech signals is obtained in that the transmitter includes a dynamic control means 20 for controlling the dynamic range of the quantizing circuit 6 for its input signal and that both the local receiver and the receiver include dynamic control means 21, 21' for controlling the dynamic range of the quantizing circuit 6 for the signal to be applied to the adders 9, 9', while the transmitter and the receiver include control generators 17, 17' fed by the input signal from the predictors 8, 8', which generators are provided with storage networks, 18, 18' and averaging networks 19, 19' for obtaining a control signal which corresponds to the average of the absolute values of the input signal for the predictors 8, 8' over a limited number of sampling periods, which control signal is applied to a control input of the dynamic control means 20 and the dynamic control means 21, 21'.

The control generators 17, 17' used in the transmitter of FIG. 1 and the receiver of FIG. 2 are built up in the same manner in which corresponding elements have the same reference numerals while those in FIG. 2 have been provided with indices. The two control generators 17, 17' are arranged in such a manner that the control signal $s$ at a sampling instant $t=nT$ corresponds to the average of the absolute values of the input signal $x_q$ of the predictors 8, 8' at a limited number N of preceding sampling instants $t=(n-1)T \ldots, t=(n-N)T$, so that there applies that:

$$S(nT) = (1/N) \sum_{i=1}^{N} \left| x_q\{(n-1)T\} \right| \qquad (4)$$

In the transmission system according to FIG. 1 and FIG. 2 N is chosen to be 4. The storage networks 18, 18' each comprise four series-arranged storage elements 22–25, 22'–25', which are controlled by the sampling frequency of 9 kHz and each of which stores a signal applied thereto for one sampling period T. The absolute values are obtained by means of full-wave rectification and this in FIG. 1 and FIG. 2 by incorporating full-wave rectifiers 26, 26' before the storage networks 18, 18'. The averaging networks 19, 19' are formed in known manner with the aid of four resistors coupling the storage elements 22–25, 22'–25' to a summing resistor from which the control signal $s$ according to formula (4) is derived.

Furthermore the dynamic control means 20 and 21, 21' for controlling the dynamic range of quantizing circuit 6 for the signal derived from difference producer 11 and the signal to be applied to adders 9, 9' are formed as amplifiers having an adjustable amplification factor. Amplifier 20 is connected to the input of quantizing circuit 6 while the amplifiers 21, 21' are connected to the outputs of the expander circuis 10, 10' so that the compression operation in quantizing circuit 6 is cancelled by a reciprocal expansion operation in expander circuits 10, 10' before the signal to be applied to adders 9, 9' undergoes a dynamic control. These amplifiers are so arranged that the amplification factor of amplifier 20 decreases and that of amplifiers 21, 21' increases with increasing values of the control signal. The control signal adjusts the amplification factor of amplifiers 21, 21' at the inverse value 1/A of the amplification factor A of amplifier 20. The adjustment of amplifiers 20, 21, 21' then has no influence on the quantized difference signal applied to adders 9, 9', provided that there is no limitation in quantizing circuit 6.

Since in practice the adjusted amplification factors A and 1/A must be accurately reproducible for a long time, the amplifiers 20, 21, 21' are not continuously, but stepwise adjustable. To this and these amplifiers include, for example, a number of stages having a fixed amplification factor which are connected with the aid of a corresponding number of switches in such a manner that a signal applied to the amplifier input is directly passed on or is passed on through one or more stages to the output. The structure of such amplifiers is generally known and need not be explained. In connection with this stepwise adjustment the control signal at the ouput of averaging networks 19, 19' is applied to evaluating circuits 27, 27' which determine in which partial interval of the total control signal range this control signal lies and which apply at each partial interval a certain adjusting signal to the amplifiers 20, 21, 21' for operation of these switches. These evaluation circuits 27, 27' may be formed, for example, as parallel-arranged threshold circuits whose respective threshold values are adjusted at the limits of two contiguous partial intervals, each threshold circuit operating a separate switch.

In the embodiment described the total control signal range between the minimum value $s=0$ and the maximum value $s=s_{max}$ is subdivided in four partial intervals so that four different adjusting signals and hence four different values of the amplification factors A and 1/A are obtained for the amplifiers 20, 21, 21'.

To obtain a structure which is most suitable for the use of digital techniques the amplification factors A and 1/A are adjusted in steps each bringing about a variation by a factor of 2. For a control signal increasing from the value $s=0$ the amplification factor A of amplifier 20 successively assumes the values 8, 4, 2, 1 and the amplification factors 1/A of the amplifiers 21, 21' successively assume the values 1/8, 1/4, 1/2, 1.

If the compressing non-uniform quantizing circuit 6 has its own dynamic range D for its input signal and consequently the expander circuits 10, 10' likewise have their own dynamic range D for their output signal, the adjustment of amplifier 20 at an amplification factor A means that the combination of amplifier 20 and quantizing circuit 6 for the difference signal $e(n)T$ derived from difference producer 11 has an effective dynamic range $D_{eff}$ which is given by:

$$D_{eff} = D/A \qquad (5)$$

The associated adjustment of the amplifiers 21, 21' at the amplification factor 1/A then results in the combination of expander circuit 10 and amplifier 21 and the combination of expander circuit 10' and amplifier 21' for the quantized difference signal $e_q(nT)$ applied to adders 9 and 9', respectively, having an effective dynamic range likewise given by formula (5). In the above-mentioned series of values of the amplification factor A this effective dynamic range $D_{eff}$ assumes successively the values D/8, D/4, D/2, D for a control signal increasing from the value $s=0$.

The limits of the partial intervals of the total control signal range at which limits the amplification factor A and thus the effective dynamic range $D_{eff}$ undergoes a variation by a factor of 2 are now chosen to be in such a manner that

- the variance of the difference signal $e(nT)$ for the respective partial intervals is different, which variance has the lowest value in the partial interval with $s=0$ as a lower limit and which variance has, with increasing values of $s$ a larger value for each next partial interval;
- the probability of occurrence of overload errors, which result when the difference signal $e(nT)$ exceeds the value $D_{eff}$ adjusted for a given partial interval, does not exceed a given very small value which is equal for all partial intervals.

Based on extensive investigations of a speech signal having a bandwidth of 4 kHz and a duration of 3 minutes the following values were chosen for the limits of the partial intervals in the relevant transmission system:

$s_{max}/64$, $s_{max}/16$, $s_{max}/8$. This choise is also determined by the aim for a structure suitable for use of digital techniques.

The table below summarizes the data. The first column indicates the partial intervals as fractions of the maximum value $s_{max}$ while the second and third columns show the associated values of the amplification factor A and the effective dynamic range $D_{eff}$.

| $s/s_{max}$ | A | $D_{eff}$ |
|---|---|---|
| 0 – 1/64 | 8 | D/8 |
| 1/64 – 1/16 | 4 | D/4 |
| 1/16 – 1/8 | 2 | D/2 |
| 1/8 – 1 | 1 | D |

It is surprisingly found from these extensive invenstigations that by using the control generators 17, 17' according to the invention a control signal $s(nT)$ is obtained which is a satisfactory measure of the order of the difference signal $e(nT)$ to be expected at the output of difference producer 11. On the basis of this control signal $s(nT)$ the effective dynamic range $D_{eff}$ of the combination of amplifier 20 and non-uniform quantizing circuit 6 can be adjusted at any instant $t = nT$ in such a manner that on the one hand the own dynamic range D of quantizing circuit 6 is always completely utilized for processing the then occurring difference signal $e(nT)$, while on the other hand the probability of overload errors due to exceeding of this own dynamic range D retains a very low value. Thus, in the relevant transmission system a considerable increase of the signal-to-quantizing-noise ratio is realized over a large dynamic range of the speech signals to be transmitted, which results in a considerable improvement of the transmission quality.

Figure 3:
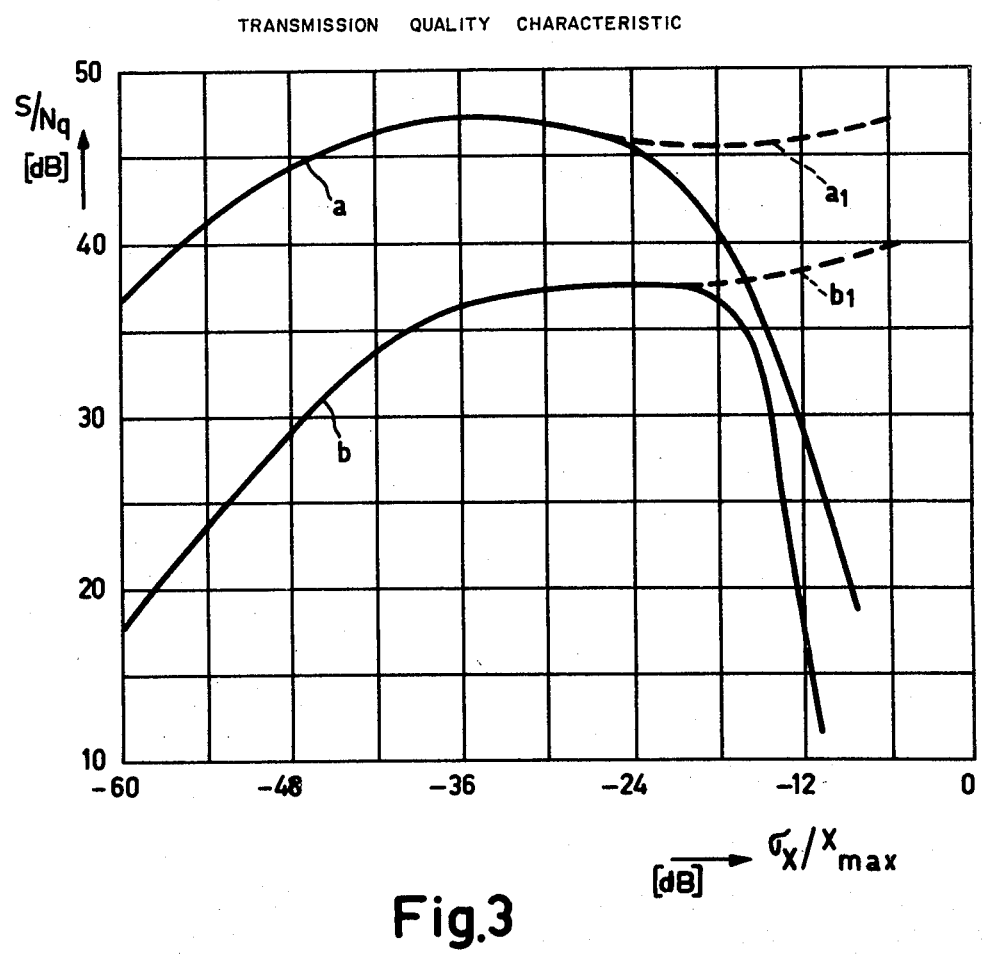
FIG. 3 shows a characteristic to illustrate the transmission quality of the transmission system according to FIGS. 1 and 2.

For the purpose of illustration FIG. 3 shows for the speech transmission system according to FIG. 1 and 2 the signal-to-quantizing-noise ratio $S/N_q$ plotted as a function of the loading of the system by the speech signals to be transmitted (curve a). The root mean square value $\sigma_x/x_{max}$ of the speech signal has been taken as a measure for loading. For speech signals this value is equal to the square root of the variance $\sigma_x^2$ because the mean value is equal to zero; furthermore the root mean square value is normalized on the maximum amplitude $x_{max}$ of the speech signal at which just no overload occurs. Both values $S/N_q$ and $\sigma_x/x_{max}$ are shown in $dB$. Furthermore FIG. 3 shows the variation of $S/N_q$ for a system in which a non-uniform PCM coding with a piecewise linear compression characteristic according to the CEPT standard has been used for the speech signal itself, namely a PCM coding in which the number of code bits per signal sample likewise as in the relevant system is 8 (curve b).

A comparison of both curves a and b in FIG. 3 shows that in the relevant system a considerable gain in the signal-to-quantizing-noise ratio is reached relative to the known system and this gain is increased as the loading of the system decreases. This gain can be used to reduce in the relevant transmission system the bandwidth required in the transmission path — that is to say, the number of code bits per signal sample — and yet reach a transmission quality comparable with that in the known system. In the relevant system the remarkable advantage is obtained that in spite of the reduction in the required bandwidth the loading range with a satisfactory transmission quality if considerably increased relative to that in the known system.

For completeness' sake FIG. 3 also shows the broken line curves $a'$, and $b'$ which represent the variation of $S/N_q$ calculated from the said investigations in the present and the known system for the physically impracticable case where the non-uniform quantizing characteristics would be continued in an unlimited manner.

As stated in the foregoing the probability of overload errors as a result of exceeding the adjusted dynamic range is very small in the relevant transmission system and it is already by this fact that their influence on the transmission quality is very small. In addition the extensive investigations show that surprisingly an overload error in the relevant transmision system practically does not give rise to a propagation of errors although such a propagation of errors may be expected on the ground of the manner of generating the prediction signal.

An overload error at the instant $t = nT$ does not only cause an error in the quantized signal sample $x_q(nT)$ in the transmitter and the receiver and hence an instantaneous increase of the quantisation noise, but at the next sampling instant $t = (n+1)T$ this overload error also causes a prediction signal $\hat{x}\{(n+1)T\}$ which is equal in the transmitter and the receiver but is erroneous. In the most unfavourable case an overload error may again be produced in the known transmission system at the instant $t=(n+1)T$ which in turn causes an overload error at the instant $t=(n+2)T$ and so forth.

The extensive investigations referred to hereinbefore show that after an overload error at the instant $t=nT$ the dynamic range in the present transmission system is automatically adjusted at the subsequent higher value so that the probability of exceeding this larger dynamic range is so drastically reduced that already at the next sampling instant $t=(n+1)T$ practically no overload errors occur any longer. Thanks to this self correcting property of the present transmission system a propagation of errors after an overload error is extremely rapidly interrupted or even entirely prevented, even in the most unfavourable case. The overload errors occurring with a small probability are thus found to have no noticeable influence in practice on the transmission quality obtained by using the steps according to the invention. relationship between By adjusting the effective dynamic range to an optimum value in each partial interval of the total control signal range a considerable improvement of the transmission quality is realized in the present transmission system, which improvement is also due to the self-correcting behaviour of the system after overload errors just for low values of the signal loading. Due to these favourable properties the transmission quality can be further improved by not only adjusting the optimum effective dynamic range in each partial interval of the total control signal range, but also by adapting the non-linear relationship between input and output signal of the non-uniform quantizing circuit in an optimum manner to the probability density function of the difference signal to be transmitted in this partial interval.

If the non-uniform quantizing circuit 6 in FIG. 1 is formed in a conventional manner so that the non-uniform distribution of the decision levels for the input signal corresponds to a uniform distribution of the associated representative levels for the output signal, the different non-linear characteristics can be realized in a simple manner by selecting for each partial interval of the control signal a suitable non-uniform distribution of the decision levels and by leaving the uniform distribution of the associated representative levels unchanged. When in the quantizing circuit 6 the network from which the decision levels are derived is formed in an adjustable manner, other piecewise linear compression characteristics and, if desired, also expansion characteristics than the mentioned piecewise linear compression characteristic according to the CEPT standard can be adjusted with the aid of the control signal. Similarly the associated reciprocal non-linear characteristics can be realized in the expander circuits 10, 10' in FIGS. 1 and 2.

In this manner the control signal obtained by using the steps according to the invention can be used for completely utilizing the available dynamic range for processing the difference signal to be transmitted, but also for adapting the compression and expansion characteristics to be used in this dynamic range to the probability density function of this difference signal. With the use of this extra degree of freedom an extra gain in the signal-to-quantizing-noise ratio in the order of 6 to 8 dB can be obtained so that the already satisfactory transmission quality of the transmission system according to the invention can be further improved considerably.

In the transmission system described so far it has been assumed that no errors occur in the transmission channel. Although in the conventional PCM transmission channels the probability of transmission errors is very low and consequently their influence on the transmission quality is likewise very low in practice, these errors may under very unfavourable circumstances give rise to a propagation of errors in the receiver which may affect the transmission quality.

The result of a transmission error is that the corresponding quantized signal samples $x_q(nT)$ in transmitter and receiver deviate from each other so that the prediction signal $\hat{x}\{(n+1)T\}$ in the receiver is likewise wrong. In the most unfavourable case this erroneous prediction in the receiver may lead sooner or later to an erroneous adjustment of the dynamic range whereafter in transmitter and receiver different prediction signals are generated and the relationship between the difference signal to be transmitted and the quantized signal samples in the receiver is lost.

In the transmission system of FIGS. 1 and 2 the continuation of an erroneous prediction in the receiver after the occurrence of transmission errors may be interrupted by transmitting, instead of the different signal $e(nT)$, the signal sample $x(nT)$ itself at regular instants.

To this end the relevant transmission system includes two synchronously operating maximum-length shift register series generators 28 and 28' which are incorporated in the transmitter of FIG. 1 and in the receiver of FIG. 2, respectively. These generators 28, 28' are constituted as a shift register having $p$ stages which are controlled in the transmitter by sampling pulse generator 4 and in the receiver by a local sampling pulse generator 29 present in a PCM synchronizing circuit 14, which shift register is provided with a modulo-2-feedback circuit. As is generally known such a generator 28, 28' may generate a pseudo-random series of binary pulses with a period $L=(2^p-1)T$ where $T$ is the sampling period. State detectors 30, 30' are connected to these generators 28, 28' which supply one pulse in each period having a length of $L$ for a given content of the shift register, for example, when all stages are in the 1 state. The output pulse from state detectors 30, 30' brings the contents of all storage elements 22–25, 22'–25' in storage networks 18, 18' to their maximum value and brings the contents of predictors 8, 8' to the value of zero. The control signal defined by formula (4) is then brought to its maximum value $s_{max}$ and thus the effective dynamic range in transmitter and receiver is likewise adjusted to its maximum value D. Furthermore the prediction signal has the value of zero at the next sampling instant so that at that instant the signal sample instead of the diference signal is transmitted. If this transmission is not interfered, the relevant transmission system operates in the normal manner at the next sampling instant. Thus, the continuation of an erroneous prediction in the receiver due to a transmission error is interrupted.

For the required synchronisation of generators 28, 28' the techniques described in the Article "Common bandwidth transmission of information signals and pseudonoise synchronization waveforms", IEEE Transactions on Communication Technology, Vo. COM-16, No. 6, December 1968, pages 796–807 can advantageously be used because then no extra bandwidth or extra time is required for the synchronization transmission. The transmitter according to FIG. 1 includes an adder 31 in which the output signal from generator 28 (having, for example, a level of −20 dB) is added to the output signal from PCM coding circuit 7 without frequency separation and time separation. In the receiver of FIG. 2 the transmitted output signal from adder 31 and the output signal from generator 28' are applied to a cross-correlator 32 for producing a control signal which is applied through a smoothing filter 33 to the local sampling pulse generator 29 in the form of a voltage-controlled oscillator. With the aid of this closed control loop an accurate and fast synchronisation of generator 28' is realised. To further reduce the already slight influence of the synchronizing signal on the transmission of the output signal from PCM coding circuit 7, the output signal from generator 28' is subtracted in a difference producer 34 from the input signal to the receiver.

It is to be noted that in the present transmission signal the steps for interrupting the erroneous prediction after a transmission error may alternatively be used after the occurrence of an overload error. For example, an overload error in transmitter and receiver may be simply determined with the aid of code detectors 35, 35' connected to PCM coding circuit 7 and PCM decoding circuit 13, respectively, and which upon the occurrence of an overload error in transmitter and receiver supply a set pulse. This set pulse brings the shift registers in generators 28, 28' in the state in which state detectors 30, 30' supply an output pulse. As already described hereinbefore, the latter results in the signal sample itself (instead of the difference signal) being transmitted at the next sampling instant. However, in practice the use of these steps after an overload error is found to be unnecessary because of the self-correcting behaviour of the transmission system so that the propagation of errors after the occurrence of an overload error is automatically interrupted or completely prevented even in the most unfavourable case.

Thus the overload errors substantially do not have any noticeable influence on the transmission quality of the speech transmission system due to its self-correcting properties, while the already slight influence of transmission errors is still further reduced by transmitting the signal sample itself at regular instants. An advantage of the synchronizing method used in this respect is that the correct operation of the transmission system is always ensured, even after interruptions in the PCM transmission channel.

The steps used in the receiver of FIG. 2 for the synchronization of generator 28' also result in an accurately synchronized local sampling frequency of 9 kHz being available. The code bit frequency required in regenerator 12 is derived therefrom with the aid of a frequency multiplier 36 which is connected to the local sampling pulse generator 29. An efficient PCM synchronizing circuit 14 is then obtained in a very simple manner which only includes a minimum number of elements.

Many modifications of the transmission system shown in FIGS. 1 and 2 are possible within the scope of this invention. For example, in FIG. 1 the functions of the compressing, non-uniform quantizing circuit 6 and the PCM coding circuit 7 may be performed in combination by a non-uniform PCM coding circuit with a piecewise linear compression characteristic according to, for example, the CEPT standard while likewise in FIG. 2 the functions of the PCM decoding circuit 13 and the expander circuit 10' may be performed in combination by the associated non-uniform PCM decoding circuit. An identical non-uniform PCM decoding circuit then performs the function of the expander circuit 10 in FIG. 1 and likewise that of the required PCM decoding of the compressed and quantized difference signal which is now exclusively available in the form of a PCM word. The structure of such non-uniform coding and decoding circuits for PCM is generally known and need not be further explained.

Furthermore it is possible to realise the required control of the dynamic range internally in the non-uniform PCM coding and PCM decoding circuits instead of externally with the aid of the adjustable amplifiers 20, 21, 21' as in FIGS. 1 and 2. Non-uniform counting coding circuits and counting decoding circuits of the type described in the U.S. Pat. No. 3,806,810 can be used advantageously.

Figure 4:
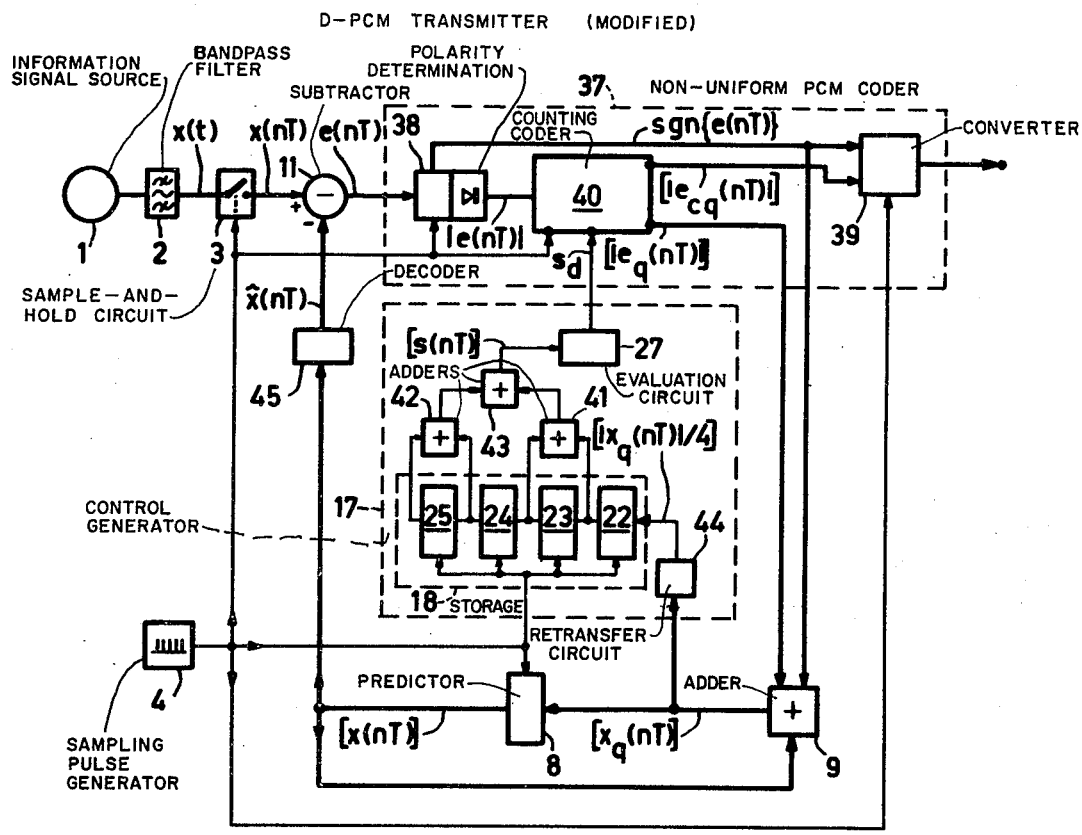
FIG. 4 shows the block schematic diagram of the transmitter and FIG. 5 shows the block schematic diagram of the receiver of a modification of the transmission system according to FIGS. 1 and 2 largely composed of digital structural elements.
Figure 5:
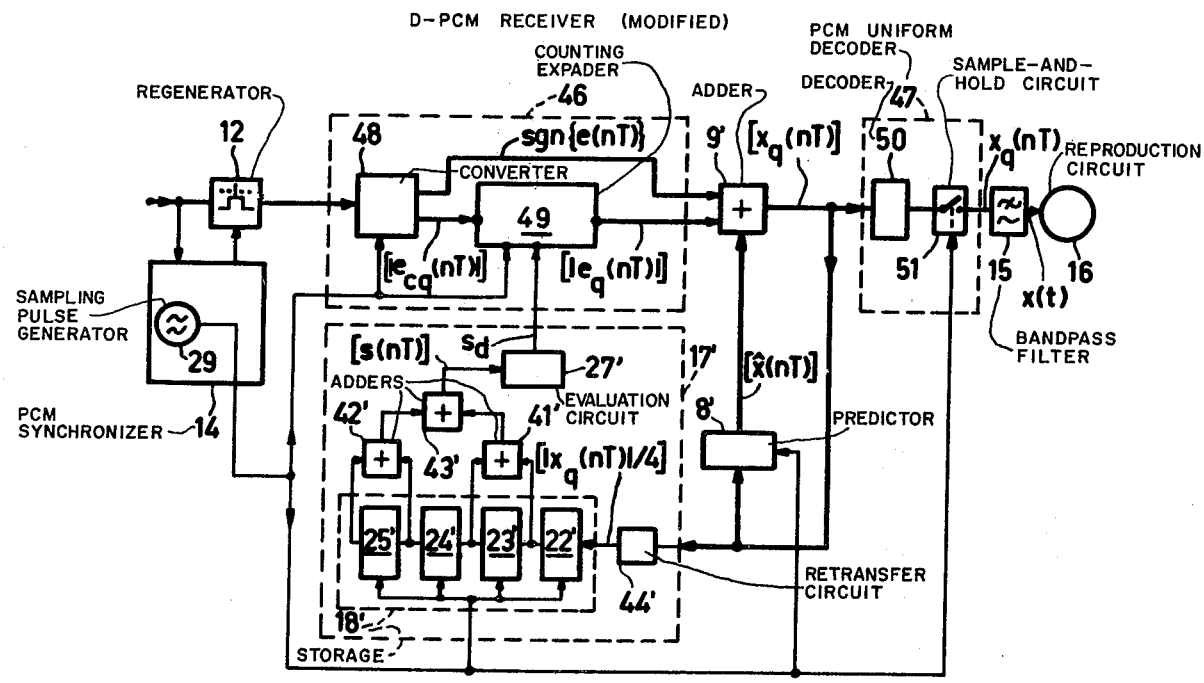

FIGS. 4 and 5 show the block schematic diagrams of a modification of the transmission system according to the invention in which the elements in FIGS. 4 and 5 corresponding to those in FIGS. 1 and 2 have the same reference numerals. The transmission system according to FIGS. 4 and 5 mainly differs from that according to FIGS. 1 and 2 by the use of the above-mentioned counting coding and counting decoding circuits and the use of digital structural elements for the construction of the predictors 8 and 8', adders 9, 9' and control generators 17, 17'.

In the transmitter according to FIG. 4 the difference signal $e(nT)$ derived from difference producer 11 is applied to a non-uniform PCM coding circuit 37 for generating a PCM word having 8 code bits which is representative of the compressed, non-uniform quantized difference signal $e_{cq}(nT)$ and which is transmitted in series form to the receiver according to FIG. 5. This non-uniform PCM coding circuit 37 includes a circuit 38 for separate determination of the polarity sgn $\{e(nT)\}$ and the magnitude $|e(nT)|$ of this difference signal $e(nT)$. The polarity signal is directly applied to one of the eight inputs of a parallel-to-series converter 39, while in counting coding circuit 40 to a PCM word having 7 code bits is generated in a parallel form from the magnitude signal, which word is representative of the magnitude of the compressed, nonuniform quantized difference signal $e_{cq}(nT)$. This PCM word in parallel form — denoted in FIG. 4 by $[|e_{cq}(nT)|]$ — is applied to the other 7 inputs of parallel-to-series converter 39.

The structure and the operation of counting coding circuit 40 in FIG. 4 will be further described with reference to FIG. 6. As will be apparent from this description, such a counting coding circuit provides the important advantage that a PCM word in parallel form is also available which is representative of the magnitude of the magnitude of the quantized, but non-compressed difference signal $e_q(nT)$ so that no separate counting decoding circuit is necessary for obtaining this signal.

The PCM word - denoted in FIG. 4 by $[|e_q(nT)|]$ — thus obtained in counting coder circuit 40 is directly applied to adder 9 together with the polarity signal sgn $\{e(nT)\}$, which adder is formed as a binary full adder with a parallel structure. A PCM word in a parallel form is also applied to this full adder 9, which word is representative of the prediction signal $\hat{x}(nT)$— denoted by $[\hat{x}(nT)]$ — and a PCM word in parallel form is then obtained at the output, which word is representative of the quantized signal samples $x_q(nT)$ — denoted by $[x_q(nT)]$. The predictor 8 is formed as a digital delay section having a parallel structure in which the PCM word $[x_q(nT)]$ is stored for one sampling period T for obtaining the PCM word $[\hat{x}(nT)]$ according to formula (2).

The control generator 17 in FIG. 4 is likewise composed completely of digital structural elements. The storage elements 22–25 of storage network 18, likewise as predictor 8, are formed as digital delay sections having a parallel structure in each of which a PCM word applied thereto is stored for one sampling period T. In control generator 17 a PCM word in a parallel form is generated according to formula (4) which word is representative of the control signal $s(nT)$ — denoted by $[s(nT)]$ — by applying to the storage network 18 the PCM word $[|x_q(nT)|/4]$ and by connecting a digital adding circuit having a pyramid structure to the storage network 18 by connecting the outputs of digital delay sections 22, 23 and 24, 25 to binary full adders 41, 42 and by connecting the outputs thereof likewise to a binary full adder 43. The PCM word $[|x_q(nT)|/4]$ is derived from the PCM word $[x_q(nT)]$ at the input of predictor 8 through a transfer circuit 44 which with the aid of selection gates suppresses both the polarity bit (formation of the absolute value) and shifts the other code bits over two positions to lower weights (this shift in weight corresponds to the division by 4 required for averaging) while the two least significant code bits are suppressed. Consequently the delay sections 22–25 may be adapted for PCM words with three code bits less than the PCM word at the input of predictor 8. The retransfer circuit 44 and full address 41–43 thus perform in combination the functions of averaging network 19 and full-wave rectifier 26 in FIG. 1.

The evaluation circuit 27 is formed as a code detector for the PCM word $[s(nT)]$ at the output of full adder 43 which comprises a code bit less than the PCM word $[x_q(nT)]$ at the input of predictor 8. This code detector 27 detects in which of the 4 code ranges corresponding to the partial intervals $(O, s_{max}/64)$, $(s_{max}/64, s_{max}/16)$, $(s_{max}/16, s_{max}/8)$ and $(s_{max}/8, s_{max})$ of the control signal range the PCM word $[s(nT)]$ is located and passes the associated detection result $s_d$ in parallel form to its output, for example, for the said succession of partial intervals as binary numbers (00), (01), (10) and (11).

Furthermore the transmitter in FIG. 4 includes a resistance decoding network 45 for generating the analog prediction signal $\hat{x}(nT)$ from the PCM word $[\hat{x}(nT)]$. This decoding network 45 is constructed in known manner with the aid of weighting resistors whose successive values are in the same ratio as successive integral powers of 2 and a summing resistor having a value which is low relative to the weighting resistor having the lowest value.

In the receiver cooperating with the transmitter of FIG. 4 a non-uniform PCM decoding circuit associated with a non-uniform PCM coding circuit 37 can be used. In the receiver according to FIG. 5, however, a split-up of this non-uniform PCM decoding circuit in a PCM code converter in the form of a digital expander circuit 46 and a uniform PCM decoding circuit 47 takes place.

The PCM word received in series form which is representative of the compressed, non-uniform quantized difference signal $e_{cq}(nT)$ is applied in FIG. 5 to digital expander circuit 46 for generating the PCM work in parallel form $[e_q(nT)]$ which is representative of the quantized, but non-compressed difference signal. This expander circuit 46 includes a series-to-parallel converter 48 having an intermediate store in which the PCM words received in series form are converted into the parallel form and are stored in the intermediate store. The polarity signal sgn $\{e(nT)\}$ then occurs at one of the eight outputs of the series-to-parallel converter 48 and the PCM word $[|e_{cq}(nT)|]$ occurs in a parallel form at the other seven outputs. The PCM word $[|e_q(nT)|]$ is generated from the PCM word $[|e_{cq}(nT)|]$ in a counting expander circuit 49, which PCM word is representative of the magnitude of the quantized, but non-compressed difference signal $e_q(nT)$.

The split-up in expander circuit 46 and uniform PCM decoding circuit 47 provides the advantage that the polarity signal sgn $\{e(nT)\}$ and the PCM word $[|e_q(nT)|]$ are available at the output of expander circuit 46 which together constitute the PCM word $[e_q(nT)]$ which can be processed in the receiver according to FIG. 5 in exactly the same manner as in the transmitter according to FIG. 4. The required elements have the same reference numerals in FIG. 5 as the corresponding elements in FIG. 4, but in FIG. 5 they are provided with indices. Also in FIG. 5 the PCM word $[\hat{x}(nT)]$ derived from predictor 8' is combined in binary full adder 9' with the PCM word $[e_q(nT)]$ derived from expander circuit 46 to produce the PCM word $[x_q(nT)]$ which is applied both to predictor 8' and to control generator 17'.

In the receiver of FIG. 5 this PCM word $[x_q(nT)]$ is also applied to the uniform PCM decoding circuit 47 for generating the analog quantized signal sample $x_q(nT)$ which is passed on to bandpass filter 15. To this end this PCM decoding circuit 47 includes a resistance decoding network 50 which is built up in the same manner as decoding network 45 of FIG. 4 and a sample-and-hold circuit 51 which is controlled by the local sampling pulse generator 29 in the PCM synchronizing circuit 14.

The structure and operation of the counting expander circuit 49 are quite similar to that of counting coding circuit 40 in FIG. 4 and will be further described with reference to FIG. 7.

Figure 6:
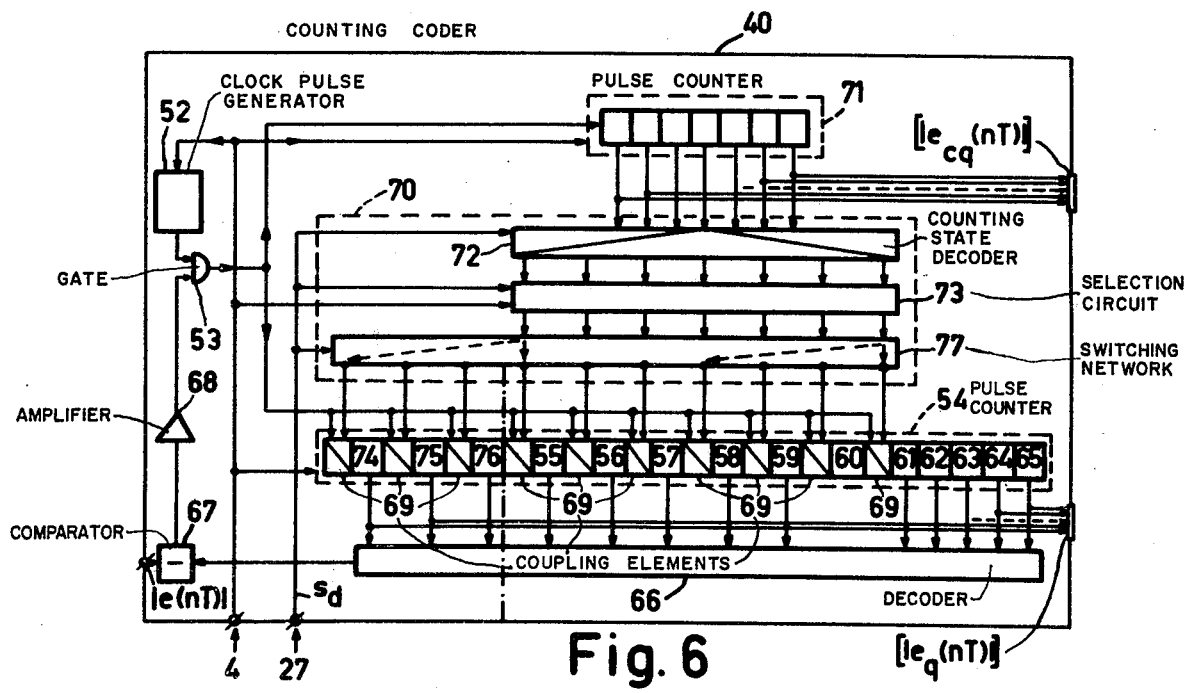
FIG. 6 shows the block schematic diagram of a counting coder circuit used in the transmitter according to FIG. 4.

FIG. 6 shows in greater detail the counting coding circuit 40 used in FIG. 4 arranged for a non-uniform coding with seven code bits per sample of the input signal. The piecewise linear compression characteristic used therein satisfies the CEPT standard and thus comprises seven segments while for an increasing input signal the quantizing step-size is increased by a factor of 2 in each subsequent segment.

The counting coding circuit in FIG. 6 includes a clock pulse generator 52 synchronised by sampling pulse generator 4 of FIG. 4, which generator supplies clock pules at a frequency of 128 times the sampling frequency. These clock pulses are applied through a gate 53 to a first binary pulse counter 54 having 11 cascade-connected binary counting stages 55–65 whose outputs are connected to a resistance decoding network 66 which is built up in the same manner as decoding networks 45 and 50 in FIGS. 4 and 5, respectively. Furthermore the counting coding circuit in FIG. 6 includes a comparator 67 to which the signal $|e(nT)|$ of circuit 38 in FIG. 4 is applied on the one hand and the quantized output signal of decoding network 66 is applied as a reference signal on the other hand. If the latter signal has a larger value than the signal to be coded, comparator 67 applies through an amplifier 68 a blocking signal to gate 53 and thus interrupts the supply of clock pulses to pulse counter 54.

In conformity with the U.S. Pat. No. 3,806,810 referred to hereinbefore a coupling element 69 for decoupling the relevant counting stage from the previous counting stages and for directly coupling clock pulse generator 52 to the relevant counting stage is added to each of the first 7 counting stages 55–61 of pulse counter 54 so that the relevant counting stage functions as the first counting stage. The coupling elements 69 are controlled by a control circuit 70 in accordance with a fixed programme. This programme is arranged in such a manner that upon commencement of coding the clock pulses are applied to the first counting stage 55 of pulse counter 54. When pulse counter 54 reaches the counting state which corresponds to the commencement of the second segment of said broken linear compresson characteristic, the first counting stage 55 is decoupled and the second counting stage 56 is coupled to clock pulse generator 52. Each clock pulse then applied to this second counting stage 56 increases the counting state of pulse counter 54 by a step having a value of 2 which exactly corresponds to the quantizing step-size for this second segment. After reaching the commencement of the third segment the second counting stage 56 is decoupled and the third counting stage 57 is coupled to clock pulse generator 52 so that each clock pulse increases the counting stage by a step having a value of 4 in accordance with the quantizing step-size for this third segment and so forth for the other segments. When the programme is carried out in this manner, a quantized signal is produced at the output of decoding network 66 whose amplitude goes through the series of quantizing values of the non-uniform quantizing scale for the input signal to be coded.

The PCM word $[|e_{cq}(nT)|]$ which represents with seven code bits the magnitude of the compressed, non-uniform quantized difference signal $e_{cq}(nT)$ is then obtained in a very simple manner with the aid of a second binary pulse counter 71 with seven cascade-connected binary counting stages, which second pulse counter 71 linearly counts the number of clock pulses applied to the first binary pulse counter 54. In fact, each clock pulse increases the counting stage of the first pulse counter 54 in one step to the counting state which corresponds to the next value of the non-uniform quantizing scale for the input signal to be coded. When as from the commencement of coding the number of steps is counted with the aid of the second pulse counter 71, the counting state of this pulse counter 71 exactly corresponds to the value of the uniform quantizing scale for the compressed output signal. At the end of the coding the desired PCM word $[|e_{cq}(nT)|]$ is available in parallel form at the 7 outputs of the second pulse counter 71.

The present counting coding circuit provides the advantage that the PCM word $[|e_q(nT)|]$ representing the value of the non-uniform quantized, but non-compressed difference signal $e_q(nT)$ is also available in parallel form at the end of coding and this at the 11 outputs of the first pulse counter 54.

The control circuit 70 is constituted in FIG. 6 by a counting state decoding network 72 connected to pulse counter 71 for decoding the counting states which mark the commencements of the seven segments of said piecewise linear compression characteristic. A selection circuit 73 having as many inputs as there are segments and as many outputs as there are different quantizing step-sizes is connected to counting state decoding network 72. In the present case each segment has its own quantizing step-size so that selection circuit 73 thus has seven pairs of associated inputs and outputs. At the commencement of, for example, the third segment, counting state decoding network 72 excites selection circuit 73 on its third input and selection circuit 73 then selects its third output so that a signal is applied to the control input of the coupling element 69 which is added to the third counting stage 57 of pulse counter 54 and this third counting stage 57 is directly coupled to clock pulse generator 52. When subsequently the commencement of the fourth segment is reached, selection circuit 73 selects its fourth output and ends the signal at its third output.

In the present counting coding circuit the sampling pulses from sampling pulse generator 4 are also used to reset the two pulse counters 54, 71 and the selection circuit 73 to their initial position at the commencement of each coding cycle.

The structure of the counting coding circuit in FIG. 6 is eminently suitable for realizing the control of the effective dynamic range $D_{eff}$, as required in the transmitter of FIG. 4, in the counting coding circuit itself. To this end the first pulse counter 54 is extended by incorporating three additional counting stages 74, 75, 76 with associated coupling elements 69 preceding the first counting stage 55 while also an associated extension of the resistance decoding network 66 is effected. Furthermore a switching network 77 having seven inputs which are connected to the outputs of selection circuit 73 and 10 outputs which are connected to the control inputs of the coupling elements 69 of the counting stages 74–76, 55–61 in pulse counter 54 is incorporated in the control circuit 70 between the selection circuit 73 and the coupling elements 69. This switching network 77 is arranged in such a manner that its 7 inputs are always interconnected to 7 successive outputs. The output signal $s_d$ of evaluation circuit 27 of FIG. 4 is also applied to this switching network 77 for adjustment to one of the four interconnection possibilities.

If switching network 77 is set to the position shown by solid line arrows in FIG. 6 in which the outputs of selection circuit 73 are interconnected to the control inputs of the coupling elements 69 of the counting stages 55–61 in pulse counter 54, the counting coding circuit operates in exactly the same manner as in the case described in which the extension has not been effected yet. The counting coding circuit then has a dynamic range D for the coded signal which is given by the maximum value of the non-uniform quantizing scale. This value is reached in a coding cycle after 127 steps, thus after 127 clock pulses from clock pulse generator 52.

It has been described in the foregoing how in the transmitter shown in FIG. 1 the effective dynamic range $D_{eff}$ for the signal to be coded can be rendered equal to D/2 by adjusting in accordance with formula (5) the amplification factor A of amplifier 20 in FIG. 1 to the value of 2, in other words by amplifying the signal to be coded by a factor of 2. In the counting coding circuit of FIG. 6 the same control of the effective dynamic range $D_{eff}$ is realized by not amplifying the signal to be coded by a factor of 2, but by attenuating the quantized output signal from decoding network 66 applied to comparator 67 as a reference signal by a factor of 2. To this end switching network 77 is set to the position in which the outputs of selection circuit 73 are interconnected to the coupling elements 69 of the counting stages 76, 55–60 in pulse counter 54. As a result the control programme determined by counting state decoding network 72 and selection circuit 73 of the coupling elements 69 commences one counting stage earlier than counting stage 55. When the counting state of pulse counter 54 is expressed in the same manner as in the foregoing in which each clock pulse applied to counting stage 55 increases the counting stage by one step having a value of 1, then this modification of the commencement of the control programme means that two clock pulses must be applied to counting, stage 76 so as to increase the counting state by one step having a value of 1. Each clock pulse applied to counting stage 67 thus increases the counting state by one step having a value of ½ and since the relationship between the counting state and the output signal from decoding network 66 has not changed, the quantizing step-size is halved for the first segment. The control programme itself is neither changed so that the quantizing step-size for each of the other segments is likewise halved as well as the maximum attainable value in a coding cycle of the output signal from decoding network 66. Consequently the effective dynamic range $D_{eff}$ is then equal to D/2.

In the same manner the effective dynamic range $D_{eff}$ in the counting coding circuit of FIG. 6 may be rendered equal to D/4 or D/8 by setting the switching network 77 to the position where the control programme begins at counting stage 75 or counting stage 74; the latter state of the switching network 77 is shown by broken line arrows in FIG. 6. The adjustment of switching network 77 is realised by the output signal $s_d$ from evaluation circuit 27 of FIG. 4.

As already stated, the effective dynamic range $D_{eff}$ is to assume the values D/8, D/4, D/2 and D in the successive partial intervals with a control signal increasing from the value $s=0$. With this succession of partial intervals the signal $s_d$ in FIG. 6 passes through the series of binary numbers (00), (01), (10) and (11). Furthermore the succession of values D/8, D/4, D/2 and D corresponds to the adjustment of switching network 77 to those states in which the control programme begins at counting stage 74, counting stage 75, counting stage 76 and counting stage 55, respectively.

For the sake of completeness the stated data are summarized in the table below. The first column shows the partial intervals as a fraction of the maximum value $s_{max}$, the second column shows the associated values $s_d$, the third column shows the associated position $p$ of the switching network 77 expressed in the counting stages of pulse counter 54 involved in the programme and the fourth column shows the associated effective dynamic range $D_{eff}$.

| $s/s_{max}$ | $s_d$ | P | $D_{eff}$ |
|---|---|---|---|
| 0 – 1/64 | 00 | 74,75,76,55,56,57,58 | D/8 |
| 1/64 – 1/16 | 01 | 75,76,55,56,57,58,59 | D/4 |
| 1/16 – 1/8 | 10 | 76,55,56,57,58,59,60 | D/2 |
| 1/8 – 1 | 11 | 55,56,57,58,59,60,61 | D |

By thus extending the counting coding circuit in FIG. 6 with the parts of pulse counter 54 and resistance decoding network 66 located on the left-hand side of the vertical chain-link line and by switching network 77 in control circuit 70, it is realised in a simple manner that the control of the effective dynamic range in the counting coding circuit itself can be effected by changing the point of commencement of the control programme. For the sake of completeness it is to be noted that the control thus realised of the dynamic range for the difference signal $e(nT)$ simultaneously results in the desired control of the dynamic range for the non-compressed quantized difference signal $e_q(nT)$.

In addition to the described possibility of reducing the effective dynamic range by a factor of 2 it is alternatively possible to extend it by a factor of 2. To obtain, for example, the value of 2D a coupling element 69 is added to counting stage 62 in FIG. 6, pulse counter 54 is extended by an additional counting stage subsequent to counting stage 65 and resistance decoding network 66 is extended in a corresponding manner and furthermore an extra interconnection possibility is given to switching network 77 so that the counting stages 56–62 are involved in the control programme.

The programme described so far of control circuit 70 is a fixed programme which is determined by counting stage decoding network 72 and selection circuit 73 and which is adapted to realise a piecewise linear compression characteristic in accordance with the CEPT-standard. It is, however, alternatively possible to select different programmes for the different partial intervals of the control signal range by making decoding network 72 and/or selection circuit 73 adjustable. As a result not only the optimum effective dynamic range can be adjusted in each partial interval, but also a compression characteristic or, if desired, an expansion characteristic which is optimally adapted to the probability density function of the difference signal $e(nT)$ in this partial interval.

It is to be noted that in the counting coding circuit according to FIG. 6 the quantisation error which at a maximum is equal to the quantizing step-size in the relevant segment of the compression characteristic always has the same polarity. By incorporating between the outputs of switching network 77 and the output of the resistance decoding network 66 a resistance network not further shown in FIG. 6, whose different resistors are chosen to be such that for each segment half the quantizing step-size is added to the output signal from resistance decoding network 66, it is realised that the quantizing error after decoding has a positive or negative polarity and a maximum value which is equal to half the quantizing step-size in the relevant segment of the compression characteristic.

Furthermore it is to be noted that in the counting coding circuit according to FIG. 6 all outputs of the first pulse counter 54 are always used for obtaining the PCM word $[|e_q(nT)|]$, in order to ensure the required accuracy when generating the PCM words $[\hat{x}(nT)]$ and $[s(nT)]$ in the transmitter according to FIG. 4, even for the lowest value of the effective dynamic range. In the described case this PCM word $[|e_q(nT)|]$ thus always has 14 code bits.

Figure 7:
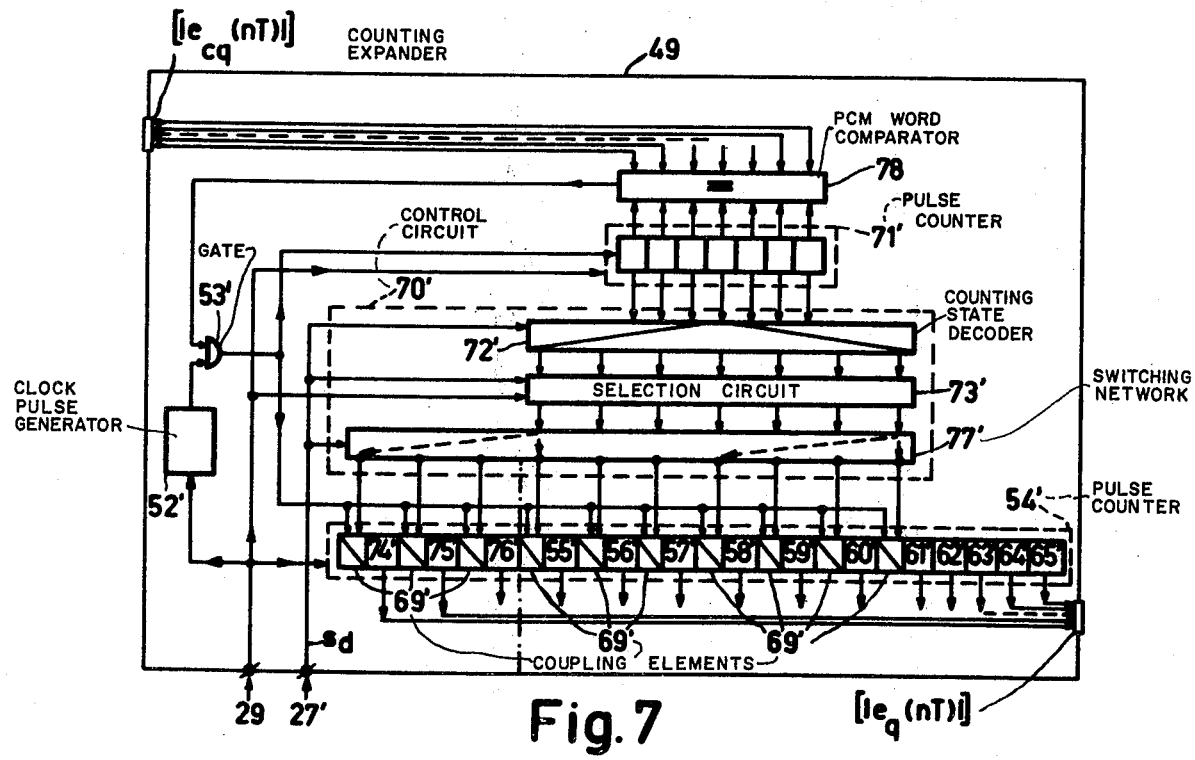
FIG. 7 shows the block schematic diagram of a counting expander circuit used in the receiver according to FIG. 5.

FIG. 7 shows in greater detail the counting expander circuit 49 used in FIG. 5 whose structure and operation largely correspond to the counting coding circuit of FIG. 6. Corresponding elements in FIG. 6 and FIG. 7 have therefore the same reference numerals and those in FIG. 7 are provided with indices. The counting expander circuit in FIG. 7 only differs from the counting coding circuit in FIG. 6 in that resistance decoding network 66, comparator 67 and amplifier 68 are absent in FIG. 7 and that furthermore in FIG. 7 a PCM word comparator is incorporated whose output signal controls gate 53′. This PCM word comparator 78 has a first group of 7 parallel inputs to which the PCM word $[|e_{cq}(nT)|]$ to be expanded of series-to-parallel converter 48 in FIG. 5 is applied and a second group of seven parallel inputs to which the PCM word at the seven outputs of the second pulse counter 71′ is applied as a reference signal.

Upon the commencement of each expansion cycle a sampling pulse of local sampling pulse generator 29 in FIG. 5 resets the two pulse counters 54′, 71′ and selection circuit 73′ to their initial position. Subsequently the clock pulses from clock pulse generator 52′ are applied to the two pulse counters 54′, 71′ until PCM word comparator 78 detects equality between the PCM word $[|e_{cq}(nT)|]$ of series-to-parallel converter 48 in FIG. 5 and the PCM word at the outputs of pulse counter 71′ and applies a blocking signal to gate 53′ to interrupt the supply of clock pulses to the two pulse counters 54′, 71′.

Since the programmes of control circuit 70 in FIG. 6 and 70′ in FIG. 7 are equal and are carried out in the same manner during a coding or expansion cycle, and since the point of commencement of the programmes is changed in the same manner by the signals $s_d$ from evaluation circuit 27 in FIG. 4 and 27′ in FIG. 5, there is the same relationship between the counting states of the first and second pulse counters 54′, 71′ in FIG. 7 at the end of the expansion cycle as there is between the counting states of the first and second pulse counters 54, 71 of FIG. 6 at the end of the coding cycle. Consequently the desired PCM word $[|e_q(nT)|]$ with 14 code bits in parallel form is available at the end of the expansion cycle at the outputs of the first pulse counter 71′ of FIG. 7.

What is claimed is:

1. A pulse code transmission system including a transmitter and a receiver, said transmitter comprising: a source of information signal; a sampling circuit for producing a sampled signal from said information signal; a quantizing circuit for producing a non-uniform quantized signal derived from said sampled signal; a pulse coding circuit for producing a pulse code modulated signal from said quantized signal; a predictor circuit having a signal input, a sampling clock input, a reset input and an output, for deriving from preceding and instantaneous signal samples a prediction signal; an adder for combining the prediction signal with the quantized signal and for applying the combined signal to the signal input of said predictor circuit; a subtractor coupled between said sampling circuit and the output of said predictor circuit for producing a difference signal from the sampled signal and the prediction signal, said difference signal being applied to said quantizing circuit; a control generator fed by said combined signal and including a combination of a storage network with an averaging network for producing a control signal corresponding to the average of the absolute values of said combined signal over a limited number of sampling periods; first dynamic control means coupled between said subtractor and said quantizing circuit for controlling the dynamic range of said quantizing circuit for said difference signal; and second dynamic control means coupled between said quantizing circuit and said adder for controlling the dynamic range of said quantized signal, each dynamic control means having a control input fed by said control signal from said control generator.

2. A pulse code transmission system as claimed in claim 1, said receiver comprising a decoding circuit for producing a decoded signal corresponding to said quantized signal, a second predictor circuit having a signal input, a sampling clock input, a reset input and an output for producing from signal samples a second prediction signal; a second adder having one input coupled to said decoding circuit and the other input coupled to the output of said second predictor circuit for combining the second prediction signal with the decoded signal and for applying the second combined signal to the signal input of said second predictor circuit; a third dynamic control means coupled between the output of said decoding circuit and said one input of said second adder for controlling the dynamic range of the decoded signal, and having a control input; a second control generator fed by the second combined signal for producing a second control signal corresponding to the average of the absolute values of said second combined signal over a limited number of sampling periods, said second control signal being applied to said control input of said third dynamic control means.

3. A transmission system as claimed in claim 2 wherein the transmitter and the receiver each include a pulse pattern generator for generating a periodical pulse pattern which is uncorrelated with the pulse code modulated signal to be transmitted, a state detector being connected to said pulse pattern generator which detector supplies one pulse during each period of the pulse pattern, which pulse is applied as a set pulse to the control generator so as to give the storage network its maximum contents and is applied as a reset pulse to the predictor to bring its contents to the value of zero, the pulse pattern in the transmitter being combined in a linear combining circuit without frequency separation and without time separation with the pulse code modulated signal to be transmitted, the total transmitted signal in the receiver together with the pulse pattern generated in the receiver being applied to a cross correlator for producing a control signal for synchronizing the pulse pattern generator in the receiver with the pulse pattern generator in the transmitter.

4. A transmission system as claimed in claim 2, wherein said dynamic control means are formed as amplifiers having an adjustable amplification factor.

5. A transmission system as claimed in claim 4, wherein the dynamic control means are stepwise adjustable and the control generator includes an evaluation circuit which for each adjustment of the dynamic control means derives a separate adjusting signal from the control signal.

6. A transmission system as claimed in claim 5, further comprising step-wise adjusting circuits for adjusting the transmission characteristics of the quantizing circuit.

7. A transmission system as claimed in claim 2, wherein said quantizing circuit in said transmitter is a compressing non-uniform quantizing circuit, said transmitter further including an expander connected between said quantizing circuit and said second dynamic control means, and said receiver including an expander connected between said decoding circuit and said third dynamic control means.

8. A transmission system as claimed in claim 7, wherein the expander in the receiver is formed as a digital expander including a counting expander fed from a PCM code converter and coupled to a uniform PCM decoding circuit, said counting expander including a clock pulse generator which is coupled to a first pulse counter through a number of coupling elements each being coupled to an assigned counting stage of the first pulse counter for decoupling the relevant counting stage from previous counting stages and for directly coupling the clock pulse generator to said counting stage, and also including a control circuit for controlling the coupling elements in accordance with a programme and a second pulse counter for linearly counting the clock pulses applied to the first pulse counter, said second pulse counter having outputs for deriving therefrom a reference signal for the signal transmitted to the receiver and to be code converted, said control circuit furthermore including a switching network connected to the coupling elements for adjusting the commencement of the control programme, said adjusting signal derived from the control generator being applied to said switching network.

9. A transmission system as claimed in claim 8, wherein the control circuit includes a combination of a counting state decoding network and a selection circuit incorporated between the second pulse counter and the switching network, said adjusting signal derived from the control generator being applied to said combination for adjustment to different control programmes.

10. A transmission system as claimed in claim 7, wherein the non-uniform quantizing circuit in the transmitter is formed as a counting coding circuit including a clock pulse generator which is coupled to a first pulse counter having a plurality of counting stages connected to a resistance decoding network for generating a reference signal for the signal to be coded, a number of coupling elements each being added to a separate counting stage of the first pulse counter for decoupling the relevant counting stage from previous counting stages and for directly coupling the clock pulse generator to said counting stage so that it operates as a first counting stage, said counting coding circuit also comprising a control circuit for controlling the coupling elements according to a programme, and a second pulse counter for linearly counting the clock pulses applied to the first pulse counter, said control circuit furthermore including a switching network connected to the coupling elements for adjusting the commencement of the control programme, the adjusting signal derived from the control generator being applied to said switching network, said second pulse counter having outputs for deriving therefrom the signal to be transmitted to the receiver and said first pulse counter having outputs for deriving therefrom the signal to be applied to the adder.

11. A transmission system as claimed in claim 10, wherein the control circuit includes a combination of a counting state decoding network and a selection circuit incorporated beween the second pulse counter and the switching network, the adjusting signal derived from the control generator being applied to said combination for adjustment to different control programmes.

12. A transmission system as claimed in claim 10, wherein the control generator includes a storage network in the form of a number of series-arranged digital delay sections each having a delay time which is equal to one sampling period, an averaging network in the form of a digital adding circuit connected to the outputs of the digital delay sections, and a transfer circuit connected to the input of the first digital delay section, and furthermore an evaluation circuit in the form of a code detector connected to the output of the digital adding circuit.

\* \* \* \* \*

UNITED STATES PATENT OFFICE
CERTIFICATE OF CORRECTION

Patent No. 3,973,199  Dated August 3, 1976

Inventor(s) Walter Widmer

It is certified that error appears in the above-identified patent and that said Letters Patent are hereby corrected as shown below:

Column 9, line 50, "different" should read -- difference --.

Signed and Sealed this

Fourth Day of October 1977

[SEAL]

Attest:

RUTH C. MASON  
Attesting Officer

LUTRELLE F. PARKER  
Acting Commissioner of Patents and Trademarks